United States Patent
Liu et al.

(10) Patent No.: US 9,453,895 B2
(45) Date of Patent: Sep. 27, 2016

(54) DYNAMIC IMAGE RECONSTRUCTION WITH TIGHT FRAME LEARNING

(71) Applicants: Jun Liu, Cary, NC (US); Qiu Wang, Princeton, NJ (US); Mariappan Nadar, Plainsboro, NJ (US); Michael Zenge, Nuremberg (DE); Edgar Mueller, Heroldsbach (DE)

(72) Inventors: Jun Liu, Cary, NC (US); Qiu Wang, Princeton, NJ (US); Mariappan Nadar, Plainsboro, NJ (US); Michael Zenge, Nuremberg (DE); Edgar Mueller, Heroldsbach (DE)

(73) Assignee: Siemens Aktiengesellschaft, Munich (DE)

( * ) Notice: Subject to any disclaimer, the term of this patent is extended or adjusted under 35 U.S.C. 154(b) by 611 days.

(21) Appl. No.: 14/027,451

(22) Filed: Sep. 16, 2013

(65) Prior Publication Data

US 2014/0097845 A1 Apr. 10, 2014

Related U.S. Application Data

(60) Provisional application No. 61/710,162, filed on Oct. 5, 2012.

(51) Int. Cl.
*G01R 33/48* (2006.01)
*G06T 5/50* (2006.01)
*G01R 33/561* (2006.01)

(52) U.S. Cl.
CPC ....... *G01R 33/4818* (2013.01); *G01R 33/5611* (2013.01); *G06T 5/50* (2013.01)

(58) Field of Classification Search
CPC .......... G01R 33/5611; G01R 33/4818; G01R 33/561; G01R 33/5616; G01R 33/56308; G06T 5/50
USPC ................. 324/300–322; 382/131, 132, 160; 600/407–422
See application file for complete search history.

(56) References Cited

U.S. PATENT DOCUMENTS

| | | | |
|---|---|---|---|
| 2013/0156283 A1* | 6/2013 | Beg | G01N 21/4795 382/131 |
| 2013/0181711 A1* | 7/2013 | Chaari | G01R 33/5611 324/309 |

\* cited by examiner

*Primary Examiner* — Dixomara Vargas
*Assistant Examiner* — Rishi Patel

(57) ABSTRACT

A computer-implemented method for learning a tight frame includes acquiring undersampled k-space data over a time period using an interleaved process. An average of the undersampled k-space data is determined and a reference image is generated based on the average of the undersampled k-space data. Next, a tight frame operator is determined based on the reference image. Then, a reconstructed image data is generated from the undersampled k-space data via a sparse reconstruction which utilizes the tight frame operator.

16 Claims, 7 Drawing Sheets

DYNAMIC IMAGE RECONSTRUCTION WITH TIGHT FRAME LEARNING

CROSS-REFERENCE TO RELATED APPLICATIONS

This application claims priority to U.S. provisional application Ser. No. 61/710,162 filed Oct. 5, 2012 which is incorporated herein by reference in its entirety.

TECHNOLOGY FIELD

The present invention relates generally to methods, systems, and apparatuses for reconstructing an image using a tight frame learned from one or more images. The disclosed methods, systems, and apparatuses may be applied to, for example, to increase the quality of Magnetic Resonance Imaging (MRI) applications such as Dynamic MRI, where acquired data is undersampled.

BACKGROUND

In recent years, Dynamic MRI has gained popularity and acceptance in clinical settings due to its ability to reveal spatial and temporal information in cardiovascular and neuroimaging studies. One of the challenges of dynamic MRI is that it requires a relatively long acquisition time compared to other medical imaging modalities such as X-ray CT. In order to fit the data acquisition time inside the motion cycles of the imaging subject, the acquired data is typically undersampled.

The undersampling inherent in dynamic MRI may be addressed through the use of Compressed Sensing (CS) techniques. Using CS, a signal may be represented using a few nonzero coefficients of a dictionary or a sparse transform. Both the dictionary and the transform can be either an orthonormal system or an over-complete system. However, the latter is generally preferable because it possesses the advantage of sparsifying the signal under a redundant system. Fixed tight frame systems, such as ridgelet, curvelet, bandlet, and shearlet, are over-complete systems that may be suitable for a dictionary or sparse transform. However, a fixed tight frame may not be optimal in applications where there is variety among the subject being imaged. For example, in medical applications, a fixed tight frame may produce poor results because the texture in a medical image varies based on, for example, the tissue type being imaged or the acquisition protocol.

SUMMARY

The present invention, as described in various embodiments herein, addresses the challenging task of image reconstruction based on undersampled k-space data. The methods, systems, and apparatuses described herein learn a tight frame using a reference frame. Thus, the limitations of fixed tight frame systems are addressed by learning the tight frame directly from the data itself.

According to some embodiments of the present invention, a computer-implemented method for learning a tight frame includes at least five steps. The ordering of these steps may vary across the different embodiments and variations of each step may be applied in each embodiment. First, undersampled k-space data is acquired over a time period using an interleaved process. In one embodiment, the interleaved process samples lines of k-space data at a predetermined sampling rate. Second, an average of the undersampled k-space data is determined. For example, in one embodiment, the average of the undersampled k-space data is determined in a temporal direction based on the time period. Third, a reference image is generated based on the average of the undersampled k-space data. In one embodiment, the reference image is generated by applying a Fourier transformation to the average of the undersampled k-space data. Fourth, a tight frame operator is determined based on the reference image. In one embodiment, the tight frame operator is further determined based on one or more additional reference images. Fifth, reconstructed image data is generated from the undersampled k-space data via a sparse reconstruction which utilizes the tight frame operator. For example, in one embodiment, the tight frame operator is used as a regularization term in the sparse reconstruction.

Various methods of determining a tight frame operator are used by embodiments of the present invention. In some embodiments, determining a tight frame operator based on the reference image includes determining a reference vector based on the reference image. In one embodiment, reference vector is determined by concatenating columns of the reference image vertically together to yield the reference vector. Next, one or more tight frame filters are initialized using an existing tight frame system. Then, an iterative process is performed to update the tight frame filters. For example, in one embodiment, the iterative process includes defining an analysis operator based on the one or more tight frame filters, determining a coefficient vector comprising tight frame coefficients by applying the analysis operator to the reference vector, updating the coefficient vector by applying a hard thresholding (or soft thresholding) operator to the tight frame coefficients, and updating the tight frame filters based on the updated coefficient vector. In one embodiment, the tight frame filters are updated using a Singular Vector Decomposition process. The iterative process may be repeated a number of times equal to a predetermined user-selected iteration number.

According to another aspect of the present invention, in some embodiments one an article of manufacture for reconstructing an image based on a learned tight frame comprises a non-transitory, tangible computer-readable medium holding computer-executable instructions for performing one or more of the methods described above. For example, in one embodiment, these instructions may be for performing a computer-implemented method for learning a tight frame which includes acquiring undersampled k-space data over a time period using an interleaved process. An average of the undersampled k-space data is determined and a reference image is generated based on the average of the undersampled k-space data. Next, a tight frame operator is determined based on the reference image. Then, a reconstructed image data is generated from the undersampled k-space data via a sparse reconstruction which utilizes the tight frame operator.

Other embodiments of the present invention include an imaging system for reconstructing an image based on a learned tight frame. The system comprises at least one RF (Radio Frequency) coil, a magnetic field gradient generator, and at least one computer. The magnetic field gradient generator is configured to generate anatomical volume select magnetic field gradients for phase encoding, and use the RF coil to acquire undersampled k-space data over a time period using an interleaved process. The at least one computer is configured to: determining an average of the undersampled k-space data, generate a reference image based on the average of the undersampled k-space data, determine a tight frame operator based on the reference image, and generate a reconstructed image data from the undersampled k-space data via a sparse reconstruction which utilizes the tight frame operator. In one embodiment, the interleaved process samples lines of k-space data at a predetermined sampling rate.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION OF ILLUSTRATIVE EMBODIMENTS

The following disclosure describes the present invention according to several embodiments directed at methods, systems, and apparatuses that employ an image reconstruction process for dynamic MRI. Briefly, the process includes three steps: obtaining a reference image, learning a tight frame from the reference image, and applying the learned operator to the reconstruction. The approach is especially applicable to reconstructing images with complex anatomical structure and texture. However, the process described herein may be utilized in a variety of image reconstruction applications.

Figure 1:
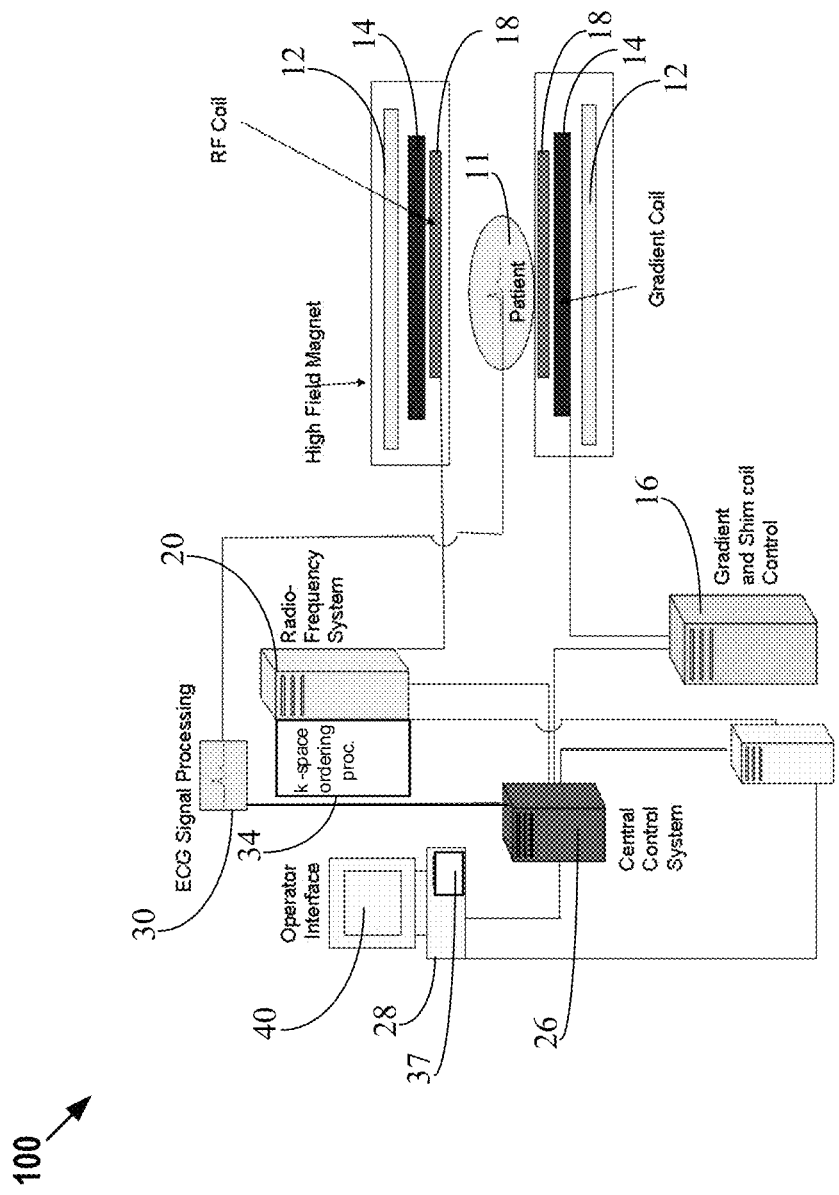
FIG. 1 shows system for acquiring MR image data, as used some embodiments of the present invention.

FIG. 1 shows system 100 for acquiring MR image data (e.g., k-space data), as used some embodiments of the present invention. In system 100, magnet 12 creates a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shimming and pulse sequence control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field and a readout gradient magnetic field that are applied to patient 11.

Further RF (radio frequency) module 20 provides RF pulse signals to RF coil 18, which in response produces magnetic field pulses which rotate the spins of the protons in the imaged body 11 by ninety degrees or by one hundred and eighty degrees for so-called "spin echo" imaging, or by angles less than or equal to 90 degrees for so-called "gradient echo" imaging. Pulse sequence control module 16 in conjunction with RF module 20 as directed by central control unit 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives MR signals, i.e., signals from the excited protons within the body as they return to an equilibrium position established by the static and gradient magnetic fields. The MR signals are detected and processed by a detector within RF module 20 and k-space component processor unit 34 to provide image representative data to an image data processor in central control unit 26. ECG synchronization signal generator 30 provides ECG signals used for pulse sequence and imaging synchronization. A two or three dimensional k-space storage array of individual data elements in unit 34 stores corresponding individual frequency components comprising an MR dataset. The k-space array of individual data elements has a designated center and individual data elements individually have a radius to the designated center.

A magnetic field generator (comprising magnetic coils 12, 14 and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components is sequentially acquired during acquisition of an MR dataset representing an MR image. A storage processor in unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components is substantially minimized.

Central control unit 26 uses information stored in an internal database to process the detected MR signals in a coordinated manner to generate high quality images of a selected slice (or slices) of the body and adjusts other parameters of system 10. The stored information comprises predetermined pulse sequence and magnetic field gradient and strength data as well as data indicating timing, orientation and spatial volume of gradient magnetic fields to be applied in imaging. Generated images are presented on display 40. Computer 28 includes a graphical user interface (GUI) enabling user interaction with central controller 26 and enables user modification of magnetic resonance imaging signals in substantially real time. Display processor 37 processes the magnetic resonance signals to provide image representative data for display on display 40, for example.

Figure 2:
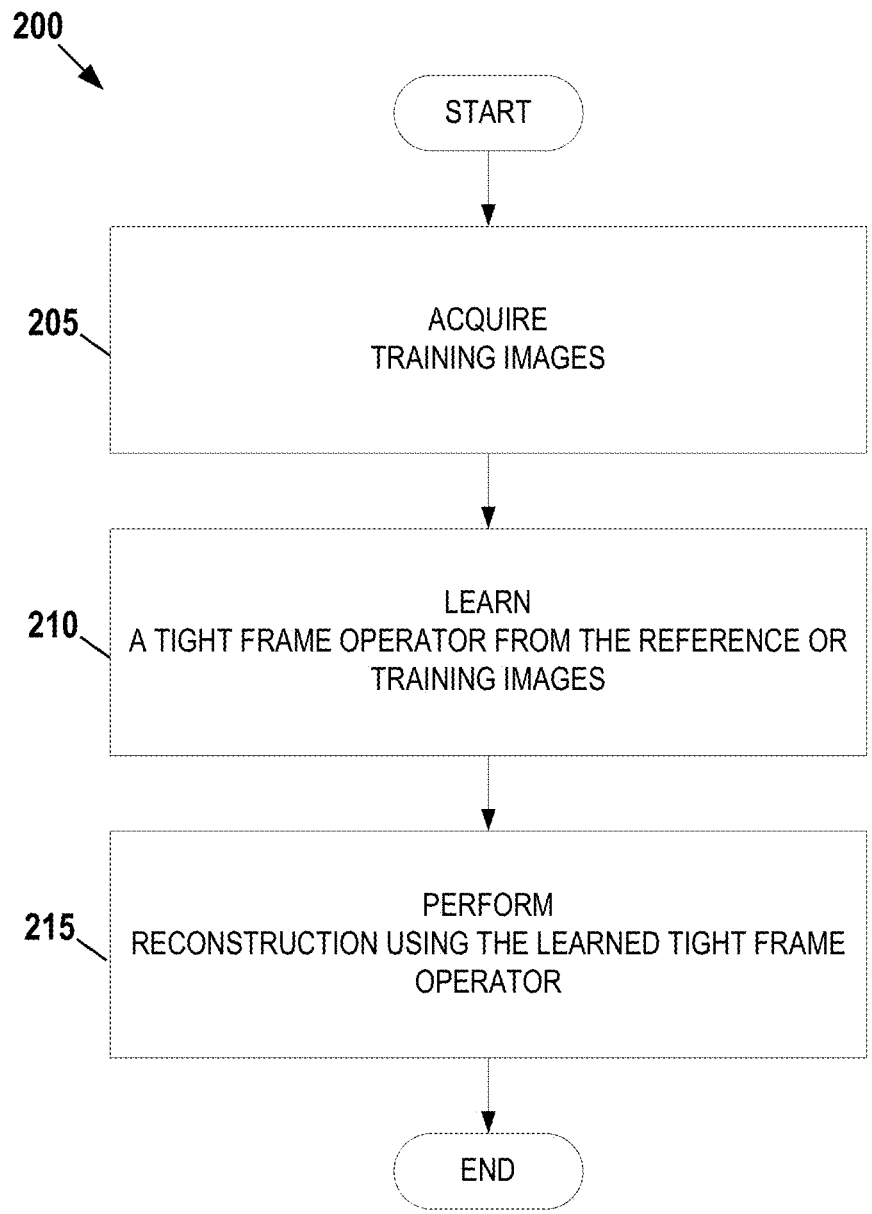
FIG. 2 provides a high-level overview of a tight frame learning process used in some embodiments of the present invention.

FIG. 2 provides a high-level overview of a tight frame learning process 200 used in some embodiments of the present invention. At 205, one or more training images are acquired, for example, using acquisition protocols which are similar to dynamic cardiac images. In some embodiments, a reference image is generated from the acquired data. One example process of acquiring images is detailed further below with reference to FIG. 3. Next, at 210, a tight frame operator is learned from the reference and/or training images. One example of a process for learning the tight frame operator is described below with reference to FIG. 4. Then, at 215, a sparsity enforcing reconstruction is performed using the learned tight frame operator.

Figure 3:
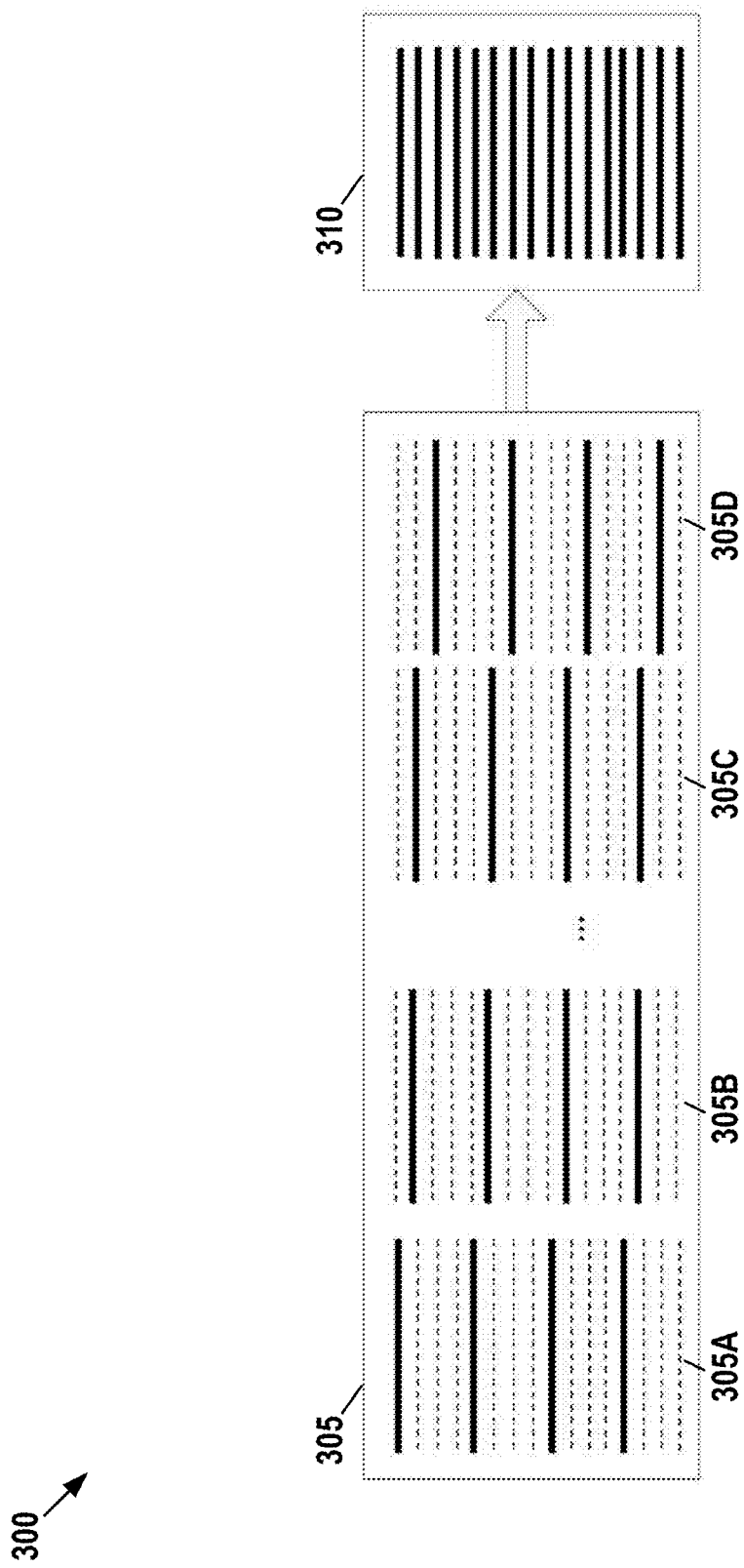
FIG. 3 illustrates an MRI acquisition process for generating reference images, as used in some embodiments of the present invention.

FIG. 3 illustrates an MRI acquisition process 300 for generating reference images, as used in some embodiments of the present invention. This process may be executed, for example, using system 100 illustrated in FIG. 1. K-space data may be undersampled in an interleaved way, as shown in 305, where plots 305A, 305B, 305C, and 305D each illustrate the sampled k-space for a given time point. In FIG. 3, acquired data illustrated as solid lines and missing data illustrated as dashed lines. A pre-determined sampling rate value may be used to specify how lines of k-space data may be acquired. In the example of FIG. 3, this sampling rate is 4. The average may be used to generate the mean (fully sampled) k-space, shown in 310 of FIG. 3. In some embodiments, this average is taken in a temporal direction. The reference image can then be determined by transforming the k-space data to image spaces, for example, using a Fourier transformation technique. It should be noted that the technique illustrated in FIG. 3 is only one example of a technique for acquiring reference images. In other embodiments, different sampling patterns or other acquisition techniques may be used. Moreover, generated images may be stored in a database or other storage medium for later use in embodiments of the tight frame learning process 200 described herein.

In some embodiments, the technique 300 utilizes the temporal Parallel Acquisition Technique (tPAT). In a tPAT acquisition, alternative phases in the time-resolved sequence acquire different phase encoding steps. This allows data to be combined from adjacent frames (or even all frames) in the time-resolved data to generate a fully sampled coil sensitivity map without the need to acquire additional data. Let $z \in C^{N_x \times N_y \times N_c \times T}$ be the tPAT k-space data, and $z_{i,j} \in C^{N_x \times N_y}$ be the k-space image from the $i^{th}$ coil at the $j^{th}$ phase, with $i \in 1, 2 \ldots N_c$ and $j \in 1, 2 \ldots T$, where T is the number of time phases and $N_x \times N_y$ is the image size or FOV. Let $I_{i,j} \in C^{N_x \times N_y}$ represent the data acquisition pattern, with matrix elements being 1 if the k-space location is acquired and 0 otherwise. The k-space data at coordinate $(m \in 1, 2 \ldots N_x, n \in 1, 2, \ldots N_y)$ of the reference image at the $i^{th}$ coil can be derived as:

$$z_i^{ref}(m,n) = \frac{\sum_{j=1}^{T} z_{i,j}(m,n)}{\sum_{j=1}^{T} I_{i,j}(m,n)}$$

Let $z^{ref} \in C^{N_x \times N_y \times N_c \times T}$ represent the reference k-space data from all coils. Due to the averaging over all time phases and the tPAT acquisition pattern, $z^{ref}$ is fully sampled. We can derive the reference image $g^{ref} \in \Re^{N_x \times N_y}$ by applying 2D Fast Fourier Transform ("FFT") to the sum of square of $z^{ref}$ over all coils.

Once the reference images and/or training images have been acquired (e.g., via method 300 of FIG. 3), a tight frame may be learned from the images. More specifically, an adaptive discrete tight frame can be constructed to form a tight frame operator W which, in turn, may be used in the calculations associated with image reconstruction.

As is well understood in the art, signals may be represented as a basis of vector space, where the signal's characteristics are presented as a group of transform coefficients. However, because a basis does not include any redundancy, any corruption or loss of the transform characteristics will, in turn, corrupt the representation of the signal. To add redundancy, an additional counterpart of the signal, known as a "frame" is used. More specifically, a frame is a set $\{f_i\}_{i=1}^s$ of elements of space S which satisfy, for a, b∈ℜ and 0<a≤b<∞, $$a\|v\|^2 < \sum_i^s |<v|f_i>|^2 \le b\|v\|^2 \text{ for all } v \in S$$

In this representation, a and b are the lower and upper frame bounds, respectively. A frame is "tight" if the frame bounds a and b are equal, such that the frame obeys a generalized Parseval's identity. More precisely, $\{f_i\}_{i=1}^s$ in a Hilbert space H will satisfy:

$$\|x\|^2 < \sum_i^s |<v|x>|^2 \text{ for all } x \in H$$

A tight frame $\{f_i\}_{i=1}^s$ is an orthonormal basis for H if and only if $\|f_i\|=1$ for all $f_i$. Thus, tight frames may be viewed as generalizations of orthonormal bases. The sequence $\{<x|f_i>\}$ is referred to as the canonical tight frame coefficient sequence. The two operators related to the tight frame are the analysis operator W (with rows forming a tight frame) and the synthesis operator $W^T$ which is the transpose of the analysis operator. The sequence $\{f_i\}_{i=1}^2$ is a tight frame if and only if $W^T W = I$ where I is the identical operator.

Figure 4:
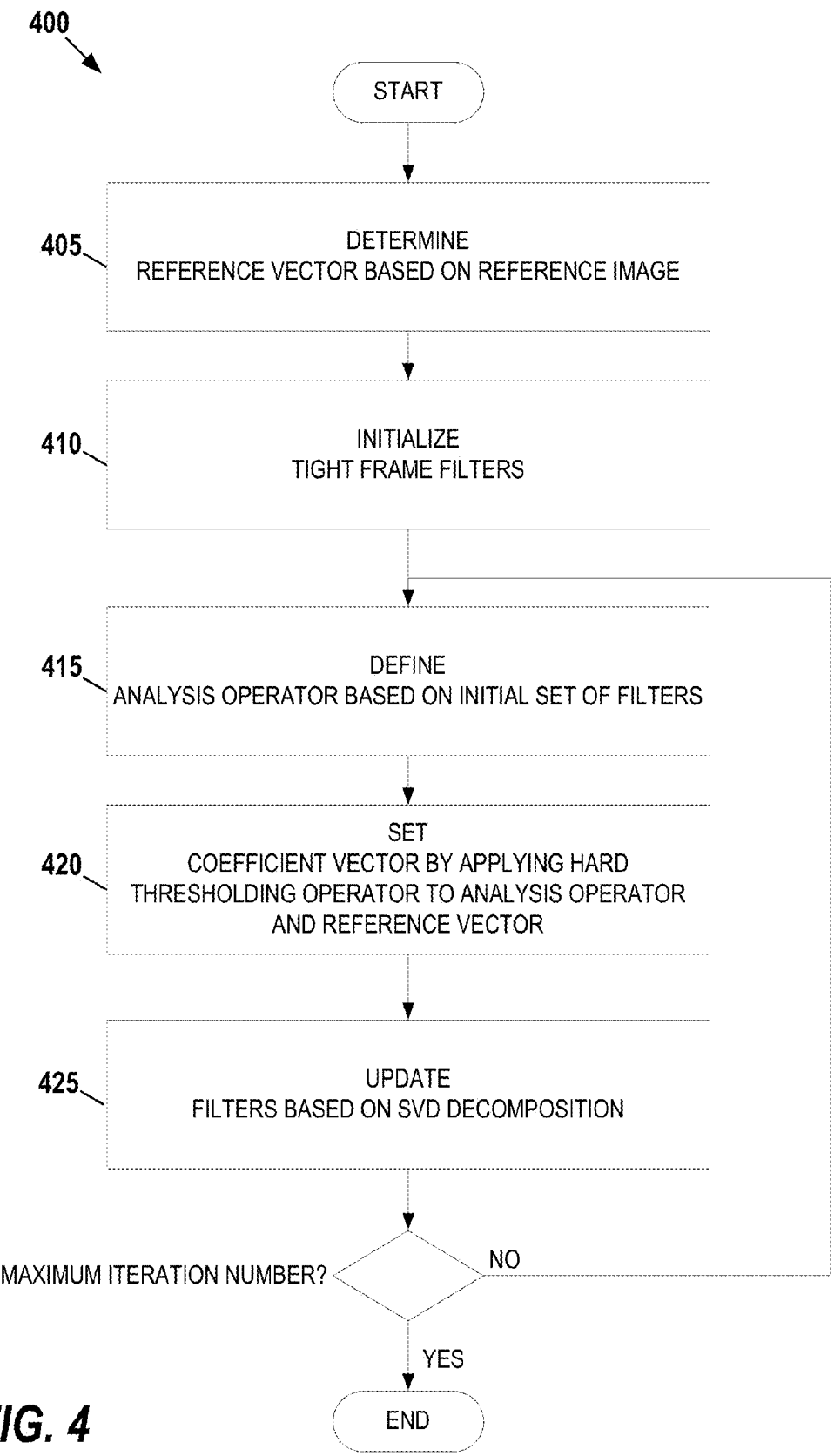
FIG. 4 illustrates one method of constructing a tight frame based on a reference image, as used in some embodiments of the present invention.

FIG. 4 illustrates one method 400 of constructing a tight frame based on a reference image. More specifically, the method 400 determines a tight frame operator W by solving the following minimization:

$$\min_{u,\{f_i\}_{i=1}^s} \|u - W(f_1, f_2, \ldots, f_s) x^{ref}\|_2^2 + \beta^2 \|u\|_0$$

subject to $W^T W = I$

In this equation, there are two unknowns: u, which is the coefficient vector that sparsely approximates the canonical tight frame coefficient $Wx^{ref}$, and $\{f_i\}_{i=1}^s$, which is the set of filters that generates a tight frame. The method 400 iteratively solves for these two unknowns by breaking the minimization equation set out above into two minimizations over the two unknowns.

The method 400 of FIG. 4 begins at 405 where a one dimensional reference vector, $X^{ref} \in R^{N_x N_y}$, is determined based on a reference or training image. In one embodiment, the reference vector is determined by concatenating all columns of the image vertically together. In other embodiments, the reference vector may be determined using other transformations of the images. Next, at 410, a set of tight frame filters are initialized. In some embodiments, one or more standard wavelet filters are used during the initialization step 410. For example in one embodiment, Haar wavelet filters are used as the initial frame filters. In other embodiments, one or more previously learned filters may be used initialize the tight frame filters at 410. The size of the filters used during initialization step 410 may be selected based on factors including, without limitation, the quality of the signal being processed, the desired fidelity in the reconstructed image, and the computational capabilities of the system constructing the tight frame. For example, larger filter sizes may be used to reduce the time required to perform image reconstruction while sacrificing fidelity in the reconstructed image. Conversely, smaller filter sizes may be used to increase the fidelity of the reconstructed image, but may require relatively long processing times.

Continuing with reference to FIG. 4, once the initialization is complete, an iterative minimization process is executed at 415, 420, and 425. For the purposes of explaining this iterative process, the variable k will be used denote the current iteration. The number of total iterations performed may be based on a variety of factors. For example, in some embodiments, the number of iterations is dependent on a comparison of the change in the resultant data from iteration to iteration. In other embodiments, the number of iterations is based on a pre-determined number. In on embodiment, this pre-determined number is selected by a user. For example, a user may hard-code the pre-determined number into the software that performs the minimization process 400 or, alternatively, the user may provide the pre-determined number at run-time as an argument to a software module, function, or method which executes the process 400.

Continuing with reference to FIG. 4, at 415, an analysis operator W(k) is derived from the filters $\{f_i^{(k)}\}_{i=1}^{s}$ using any technique known in the art. Next, at 420, a coefficient vector $u^{(k+1)}$ is determined by applying a hard-thresholding operator $T_\beta$ over the tight frame coefficients $Wx^{ref}$. In some embodiments, a soft-thresholding operator is used rather than hard-thresholding operator $T_\beta$. Then, at 425, the filters $\{f_i^{(k+1)}\}_{i=1}^{s}$ are updated based on the coefficient vector. In one embodiment, the filters are updated based on a singular value decomposition (SVD). Once the process 400 concludes, a tight frame operator W, defined by filters $\{f_i^{(k)}\}_{i=1}^{s}$ will be available for use in reconstruction.

In the example described in FIG. 4, the algorithm utilizes a single reference image to learn the tight frame operator W. However, in other embodiments of the present invention, the algorithm is extended to learn the operator from multiple reference and/or training images. Such embodiments may be applied, for example, in clinical settings where images associated with multiple patients are acquired or where multiple images associated with a single patient are acquired (e.g., in follow-up scans). In these embodiments, the filters are solved by a SVD of the sum of the matrices from the hard-thresholding step 420, for each of the training data. In one embodiment, the minimization formulation is as follows, with each training data indexed by r:

$$\min_{\{u\}_{r=1}^{N_r}, \{f_i\}_{i=1}^{s}} \frac{1}{N_r} \sum_{r=1}^{N_r} \{\|u - W(f_1, f_2, \ldots, f_s) x_r^{ref}\|_2^2 + \beta^2 \|u_r\|_0\}$$

subject to $W^T W = I$

Figure 5:
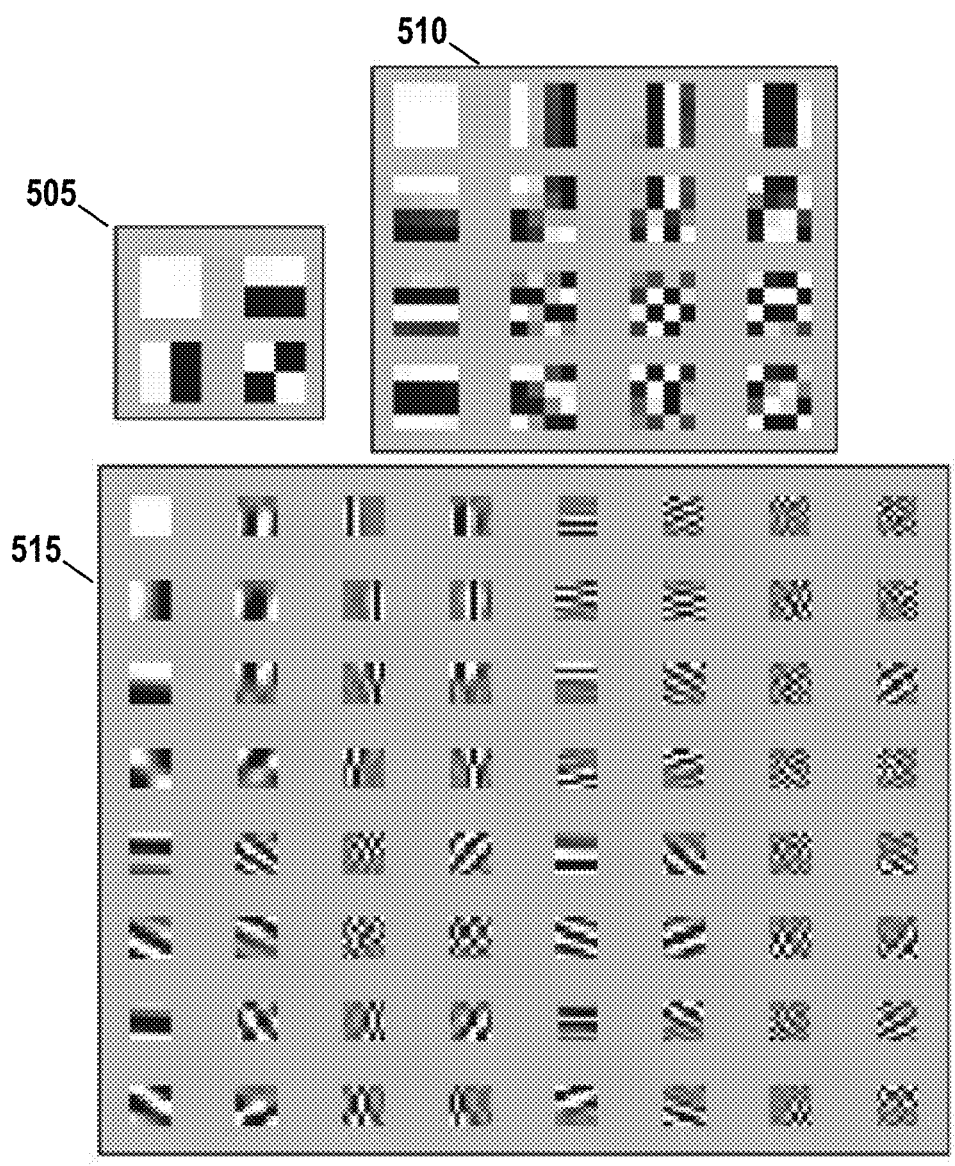
FIG. 5 provides examples of learned filters used for generating a tight frame, one or more of which may be used in embodiments of the present invention.

FIG. 5 provides examples of learned filters used for generating a tight frame, one or more of which may be used in embodiments of the present invention. These filters result from a learning process such as process 400 shown in FIG. 4. In FIG. 5, a 2 pixels×2 pixels filter set 505, a 4 pixels×4 pixels filter set 510, and a 8 pixels×8 pixels filter set 515 are shown. Each square corresponds to a vector in the set of filters $\{f_i\}_{i=1}^{s}$ in the matrix form.

With the learned tight frame, image reconstruction can be performed. Due to the redundancy of the tight frame system, the mapping from the signals to the coefficients is not bijective. Thus, the coefficient vector for representing the signals is not unique and there may be various approaches used for signal recovery. For example, in one embodiment, a synthesis-based approach is used, focusing on representing the signal through a linear combination of a dictionary. The corresponding minimization problem in these embodiments may include a penalty term of the $L_P$ (p=0 or 1) norm of the coefficients u, enforcing the sparsity of the coefficient vector. In other embodiments, an analysis-based approach is used, using the tight frame operator W, where the minimization problem may again include a penalty term of the $L_P$ norm of the canonical coefficient vector Wx. In another embodiment, a balanced-approach is used which assumes the underlying signal x to be synthesized from some sparse coefficient vector u with $x=W^T u$. As its name describes, the balanced approach aims to balance the analysis and synthesis based approaches.

For example, in one embodiment, the reconstruction process is based on the following minimization:

$$\min_{x} \frac{1}{2} \sum_{i=1}^{N_c} \|F_u(c_i \odot x) - y\|_2^2 + \lambda \|Wx\|_1$$

In this equation, x is a one-dimensional vector which is the vectorized version of the signal to be reconstructed (e.g., an image). The vector x may be generated, for example, by concatenating columns of the signal together vertically. For dynamic imaging, the signal to be reconstructed is three-dimensional if the data is a time sequence of two-dimensional images, or four dimensional if the data is a time sequence of three-dimensional images. $N_c$ is the number of coils used by the MR device. $F_u$ is an operator for image acquisition which includes Fourier transform and undersampling in k-space. The term $c_i$ is the coil sensitivity profile for the ith coil, and y is the acquired k-space data written in the vectorized form. The regularization term $\lambda \|Wx\|_1$ is the $l_1$-norm of the signal in the transform domain, where W represents the tight frame operator derived, for example, via process 400 illustrated in FIG. 4.

Figure 6:
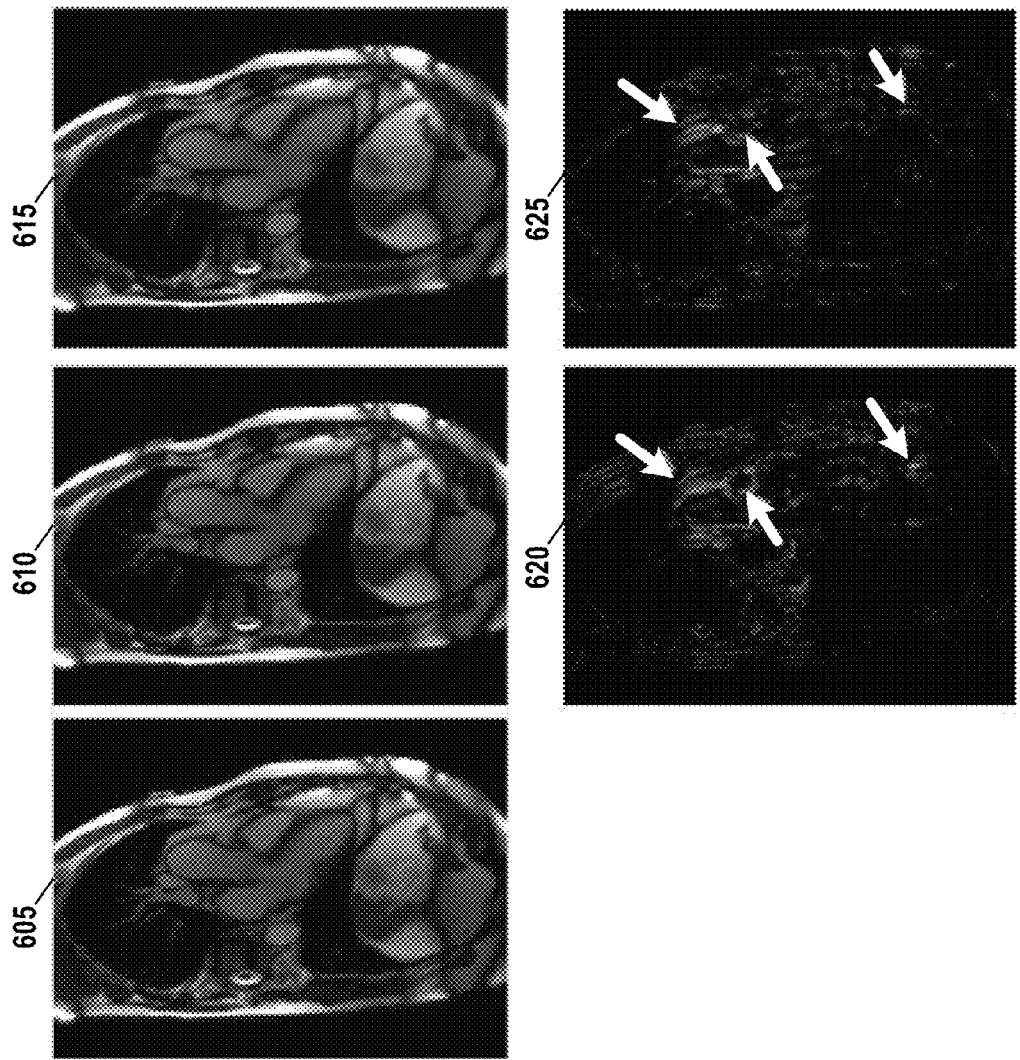
FIG. 6 provides examples of reconstructed cardiac images generated by one embodiment of the invention as described herein.

FIG. 6 provides examples 600 of reconstructed cardiac images generated by one embodiment of the invention as described herein. Specifically, FIG. 6 includes a first image 605 showing ground truth at a time phase 1. Image 610 shows a reconstruction from a 8×8 size redundant Haar wavelet transform of undersampled data at time phase 1. Image 615 shows a reconstruction from a 8×8 transform of the undersampled data at time phase 1, as learned by one embodiment of the present invention. The differences between images 610 and 615 and the ground truth image 605 are shown in images 620 and 625, respectively. The learned transform, as shown in 625 results in less difference from the ground truth compared to the redundant Haar wavelet transform, as shown in 620.

Figure 7:
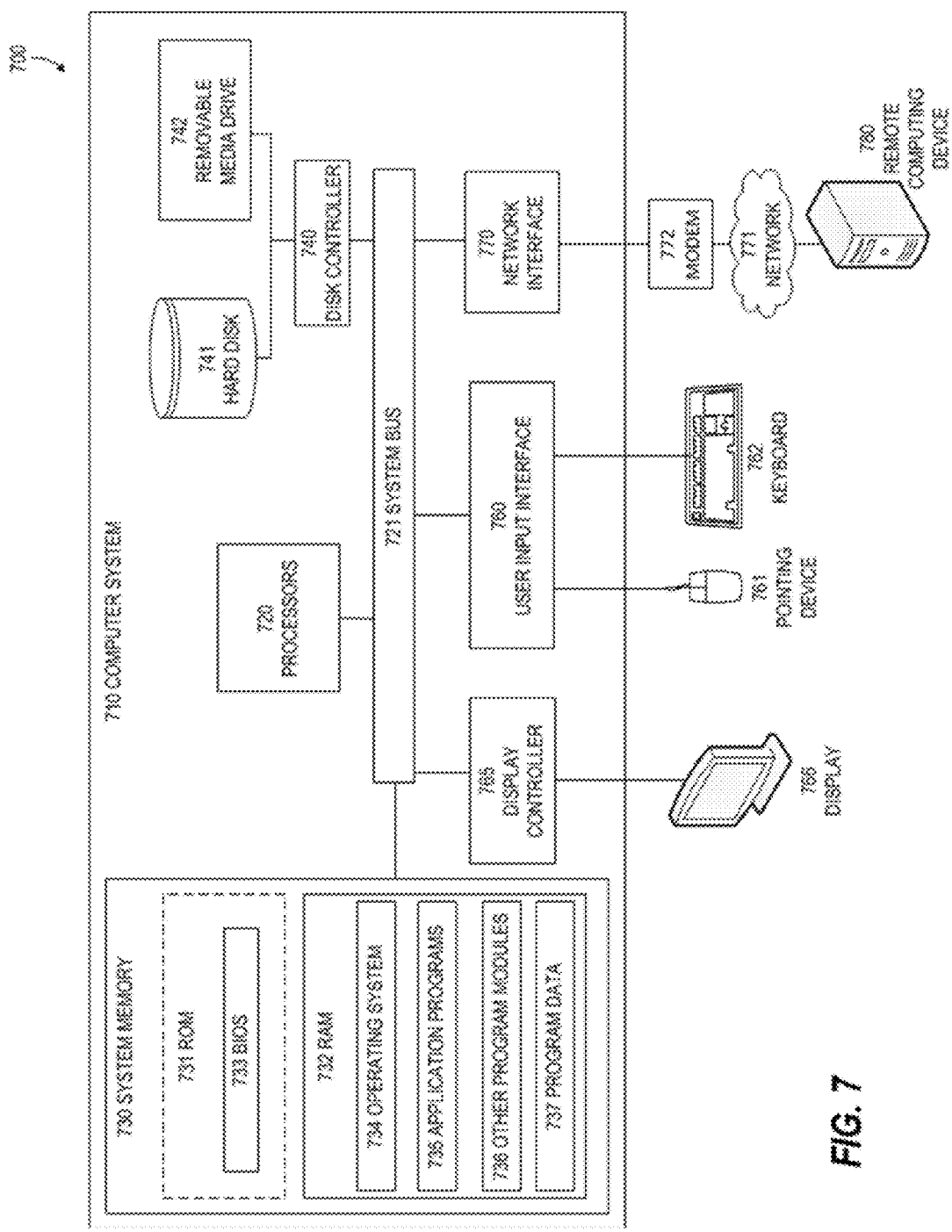
FIG. 7 illustrates an exemplary computing environment within which embodiments of the invention may be implemented.

FIG. 7 illustrates an exemplary computing environment 700 within which embodiments of the invention may be implemented. For example, this computing environment 700 may be used to implement the method 400 of constructing a tight frame based on a reference image described in FIG. 4. The computing environment 700 may include computer system 710, which is one example of a computing system upon which embodiments of the invention may be implemented. Computers and computing environments, such as computer 710 and computing environment 700, are known to those of skill in the art and thus are described briefly here.

As shown in FIG. 7, the computer system 710 may include a communication mechanism such as a bus 721 or other communication mechanism for communicating information within the computer system 710. The system 710 further includes one or more processors 720 coupled with the bus 721 for processing the information. The processors 720 may include one or more central processing units (CPUs), graphical processing units (GPUs), or any other processor known in the art.

The computer system 710 also includes a system memory 730 coupled to the bus 721 for storing information and instructions to be executed by processors 720. The system memory 730 may include computer readable storage media in the form of volatile and/or nonvolatile memory, such as read only memory (ROM) 731 and/or random access memory (RAM) 732. The system memory RAM 732 may include other dynamic storage device(s) (e.g., dynamic RAM, static RAM, and synchronous DRAM). The system memory ROM 731 may include other static storage device(s) (e.g., programmable ROM, erasable PROM, and electrically erasable PROM). In addition, the system memory 730 may be used for storing temporary variables or other intermediate information during the execution of instructions by the processors 720. A basic input/output system 733 (BIOS) containing the basic routines that help to transfer information between elements within computer system 710, such as during start-up, may be stored in ROM 731. RAM 732 may contain data and/or program modules that are immediately accessible to and/or presently being operated on by the processors 720. System memory 730 may additionally include, for example, operating system 734, application programs 735, other program modules 736 and program data 737.

The computer system 710 also includes a disk controller 740 coupled to the bus 721 to control one or more storage devices for storing information and instructions, such as a magnetic hard disk 741 and a removable media drive 742 (e.g., floppy disk drive, compact disc drive, tape drive, and/or solid state drive). The storage devices may be added to the computer system 710 using an appropriate device interface (e.g., a small computer system interface (SCSI), integrated device electronics (IDE), Universal Serial Bus (USB), or FireWire).

The computer system 710 may also include a display controller 765 coupled to the bus 721 to control a display or monitor 765, such as a cathode ray tube (CRT) or liquid crystal display (LCD), for displaying information to a computer user. The computer system includes an input interface 760 and one or more input devices, such as a keyboard 761 and a pointing device 762, for interacting with a computer user and providing information to the processor 720. The pointing device 762, for example, may be a mouse, a trackball, or a pointing stick for communicating direction information and command selections to the processor 720 and for controlling cursor movement on the display 766. The display 766 may provide a touch screen interface which allows input to supplement or replace the communication of direction information and command selections by the pointing device 761.

The computer system 710 may perform a portion or all of the processing steps of embodiments of the invention in response to the processors 720 executing one or more sequences of one or more instructions contained in a memory, such as the system memory 730. Such instructions may be read into the system memory 730 from another computer readable medium, such as a hard disk 741 or a removable media drive 742. The hard disk 741 may contain one or more datastores and data files used by embodiments of the present invention. Datastore contents and data files may be encrypted to improve security. The processors 720 may also be employed in a multi-processing arrangement to execute the one or more sequences of instructions contained in system memory 730. In alternative embodiments, hardwired circuitry may be used in place of or in combination with software instructions. Thus, embodiments are not limited to any specific combination of hardware circuitry and software.

As stated above, the computer system 710 may include at least one computer readable medium or memory for holding instructions programmed according embodiments of the invention and for containing data structures, tables, records, or other data described herein. The term "computer readable medium" as used herein refers to any medium that participates in providing instructions to the processor 720 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 741 or removable media drive 742. Non-limiting examples of volatile media include dynamic memory, such as system memory 730. Non-limiting examples of transmission media include coaxial cables, copper wire, and fiber optics, including the wires that make up the bus 721. Transmission media may also take the form of acoustic or light waves, such as those generated during radio wave and infrared data communications.

The computing environment 700 may further include the computer system 720 operating in a networked environment using logical connections to one or more remote computers, such as remote computer 780. Remote computer 780 may be a personal computer (laptop or desktop), a mobile device, a server, a router, a network PC, a peer device or other common network node, and typically includes many or all of the elements described above relative to computer 710. When used in a networking environment, computer 710 may include modem 772 for establishing communications over a network 771, such as the Internet. Modem 772 may be connected to system bus 721 via user network interface 770, or via another appropriate mechanism.

Network 771 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 710 and other computers (e.g., remote computing system 780). The network 771 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 771.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A computer-implemented method for reconstructing an image based on a learned tight frame, the method comprising:
    acquiring undersampled k-space data over a time period using an interleaved process;
    determining an average of the undersampled k-space data;
    generating a reference image based on the average of the undersampled k-space data;
    determining a tight frame operator based on the reference image; and
    generating a reconstructed image data from the undersampled k-space data via a sparse reconstruction which utilizes the tight frame operator,
    wherein determining a tight frame operator based on the reference image comprises:
    determining a reference vector based on the reference image;
    initializing one or more tight frame filters using an existing tight frame system; and
    performing an iterative process comprising:
        defining an analysis operator based on the tight frame filters,
            determining a coefficient vector comprising a plurality of tight frame coefficients by applying the analysis operator to the reference vector,
            updating the coefficient vector by applying a hard thresholding operator to the tight frame coefficients, and
        updating the tight frame filters based on the updated coefficient vector.

2. The method of claim 1, wherein the interleaved process samples lines of k-space data at a predetermined sampling rate.

3. The method of claim 1, wherein the average of the undersampled k-space data is determined in a temporal direction based on the time period.

4. The method of claim 1, wherein generating the reference image based on the average of the undersampled k-space data comprises:
    applying a Fourier transformation to the average of the undersampled k-space data.

5. The method of claim 1, wherein determining the reference vector based on the reference image comprises:
    concatenating columns of the reference image vertically together to yield the reference vector.

6. The method of claim 1, wherein the tight frame filters are updated using a Singular Vector Decomposition process.

7. The method of claim 1, wherein the iterative process is repeated a number of times equal to a predetermined user-selected iteration number.

8. The method of claim 1, wherein the tight frame operator is used as a regularization term in the sparse reconstruction.

9. The method of claim 1, wherein the tight frame operator is further determined based on one or more additional reference images.

10. An article of manufacture for reconstructing an image based on a learned tight frame, the article of manufacture comprising a non-transitory, tangible computer-readable medium holding computer-executable instructions for performing a method comprising:
    acquiring undersampled k-space data over a time period using an interleaved process;
    determining an average of the undersampled k-space data;
    generating a reference image based on the average of the undersampled k-space data;
    determining a tight frame operator based on the reference image; and
    generating a reconstructed image data from the undersampled k-space data via a sparse reconstruction which utilizes the tight frame operator,
    wherein determining a tight frame operator based on the reference image comprises:
    determining a reference vector based on the reference image;
    initializing one or more tight frame filters using an existing tight frame system; and
    performing an iterative process comprising:
        defining an analysis operator based on the tight frame filters,
            determining a coefficient vector comprising a plurality of tight frame coefficients by applying the analysis operator to the reference vector,
            updating the coefficient vector by applying a hard thresholding operator to the tight frame coefficients, and
        updating the tight frame filters based on the updated coefficient vector.

11. The article of manufacture of claim 10, wherein the average of the undersampled k-space data is determined in a temporal direction based on the time period.

12. The article of manufacture of claim 10, wherein determining the reference vector based on the reference image comprises:
    concatenating columns of the reference image vertically together to yield the reference vector.

13. The article of manufacture of claim 10, wherein the tight frame filters are updated using a Singular Vector Decomposition process.

14. The article of manufacture of claim 10, wherein the iterative process is repeated a number of times equal to a predetermined user-selected iteration number.

15. The article of manufacture of claim 10, wherein the tight frame operator is used as a regularization term in the sparse reconstruction.

16. The article of manufacture of claim 10, wherein the tight frame operator is further determined based on one or more additional reference images.

* * * * *